(12) United States Patent
Gibson et al.

(10) Patent No.: US 7,183,823 B2
(45) Date of Patent: Feb. 27, 2007

(54) METHOD OF GENERATING A PULSED OUTPUT SIGNAL FROM A PERIODIC RAMP SIGNAL AND A REFERENCE VOLTAGE, AND A SWITCH MODE POWER CONVERTER

(75) Inventors: Neil Gibson, Freising (DE); Kevin Scoones, Munich (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/080,882

(22) Filed: Mar. 15, 2005

(65) Prior Publication Data

US 2005/0248378 A1   Nov. 10, 2005

(30) Foreign Application Priority Data

Mar. 20, 2004   (DE) ...................... 10 2004 016 073

(51) Int. Cl.
*H03K 5/12* (2006.01)
(52) U.S. Cl. ......................... 327/170; 363/15
(58) Field of Classification Search ........ 327/170–175; 363/15, 34, 71, 21.12; 323/282, 283
See application file for complete search history.

(56) References Cited

U.S. PATENT DOCUMENTS

| | | | |
|---|---|---|---|
| 3,393,363 A | 7/1968 | Forster | 398/191 |
| 6,057,675 A * | 5/2000 | Tateishi | 323/283 |
| 6,208,216 B1 | 3/2001 | Nasila | 332/110 |
| 6,208,516 B1 | 3/2001 | Fangonilo et al. | 361/704 |
| 6,825,644 B2 * | 11/2004 | Kernahan et al. | 323/283 |

FOREIGN PATENT DOCUMENTS

| | | |
|---|---|---|
| GB | 2247123 A | 2/1992 |
| WO | 98/27648 | 6/1998 |

* cited by examiner

*Primary Examiner*—Linh My Nguyen
(74) *Attorney, Agent, or Firm*—W. James Brady, III; Frederick J. Telecky, Jr.

(57) ABSTRACT

In the proposed method of generating a pulsed output signal from a periodic ramp signal and a reference voltage, the linear range of duty cycles of the pulsed output signal is significantly extended to minimum values. The ramp signal and the reference voltage are applied to inputs of a comparator and the output signal is taken from an output of the comparator. The ramp signal has a ramp that extends between a minimum voltage level and a maximum voltage level. The duty cycle of the pulse signal is controlled by varying the reference voltage between the minimum and maximum voltage levels. The ramp has an initial start section extending from the minimum voltage level and a main section extending between the initial section and the maximum voltage level. The ramp slope has a constant value over the main ramp section and a value greater than the constant value over the initial section. In the initial section of the ramp the slope is varied in a manner to compensate for non-linearity of the comparator in an operating range where the reference voltage is close to the minimum voltage level of the ramp signal. It is also preferred to insert a short blanking period before the actual ramp of the waveform. The method can be used in switched mode power converters and in class-d amplifiers.

11 Claims, 4 Drawing Sheets

… (1)

METHOD OF GENERATING A PULSED OUTPUT SIGNAL FROM A PERIODIC RAMP SIGNAL AND A REFERENCE VOLTAGE, AND A SWITCH MODE POWER CONVERTER

CROSS REFERENCE TO RELATED APPLICATIONS

This application claims priority under 35 USC § 119 of German Application Serial No. 102004016073.2, filed Mar. 30, 2004.

FIELD OF THE INVENTION

The present invention relates to a method of generating a pulsed output signal from a periodic ramp signal and a reference voltage. Such a method can be used in switch mode power converters and in class-d amplifiers. The invention also relates to a switch mode power converter wherein the inventive method is used, and to an oscillator for use in an implementation of the invention.

BACKGROUND OF THE INVENTION

Basically, to generate a pulsed output signal from a periodic ramp signal and a reference voltage, the ramp signal and the reference voltage are applied to inputs of a comparator. The output signal taken from the comparator is the desired pulse signal, the duty cycle of which is steered by adjusting the reference voltage.

Typical prior art switch mode power converters have a supply input and an output that provides a regulated supply voltage. For example, U.S. Pat. No. 5,600,234 shows a DC-DC buck converter with a switching cell that transforms an input voltage to a regulated supply voltage lower than the input voltage. The switching cell is controlled by a pulse signal that has a fixed period and a variable duty cycle. The pulse signal is provided by a summing comparator. The summing comparator has a first differential input pair to which a saw-tooth waveform signal is applied that determines the fixed period of the pulse signal. The duty cycle of the pulse signal is set by a first feedback loop that feeds the a fraction of the voltage at the output of the switching cell to an inverting input of the summing comparator, and by a second feedback loop that includes an integrating differential amplifier. While the first feedback loop ensures a fast transient response, it also introduces a DC error. The second feedback loop has a high gain but slow transient response to correct for the DC error and provide a stable steady-state operating point.

When switched mode converters and class-d amplifiers operate towards minimum duty cycles using a periodic signal with a linear saw-tooth waveform, non-linearity present in the comparator has the effect of increasing the small-signal gain in the control loop. This destabilizes the control loop, resulting in a potential for oscillation. Therefore, small minimum values of duty cycle cannot be achieved with conventional converters.

SUMMARY OF THE INVENTION

The present invention provides a method of generating a pulsed output signal from a periodic ramp signal and a reference voltage, wherein the linear range of duty cycles of the pulsed output signal is significantly extended to minimum values. Specifically, the invention provides a method of generating a pulsed output signal from a periodic ramp signal and a reference voltage, the ramp signal and the reference voltage being applied to inputs of a comparator and the output signal being taken from an output of the comparator. The ramp signal has a ramp that extends between a minimum voltage level and a maximum voltage level. The duty cycle of the pulse signal is controlled by varying the reference voltage between the minimum and maximum voltage levels. The ramp has an initial start section extending from the minimum voltage level and a main section extending between the initial section and the maximum voltage level. The ramp slope has a constant value over the main ramp section and a value greater than the constant value over the initial section.

Preferably, the slope in the initial section of the ramp is varied in a manner to compensate for non-linearity of the comparator in an operating range where the reference voltage is close to the minimum voltage level of the ramp signal. It is also preferred to insert a short blanking period before the actual ramp of the waveform.

In another aspect of the invention, a switch mode power converter is provided wherein the principles of the invention are used. The converter comprises a switching cell with a supply input, an output and a control input. A summing comparator has first and second differential input pairs and an output. The output is connected to the control input of the switching cell. An oscillator provides a periodic waveform that is applied to a first one of the inputs of the first differential input pair of the summing comparator. An adjustable reference voltage source provides an adjustable reference voltage a predetermined fraction of which is applied to a second one of the inputs of the first differential input pair of the summing comparator. An error amplifier has differential outputs coupled to the second pair of differential inputs of the summing comparator and a differential input pair. A first input of the differential input pair is coupled to the output of the switching cell, and the adjustable reference voltage from the adjustable reference voltage source is applied to a second input of the differential input pair. Thus, the desired DC voltage is scaled to produce a DC reference for the comparator which generates the desired duty cycle for the pulse signal that drives the switching cell, and thus the desired regulated output voltage, with only minor corrections required across the error terminals to correct small parasitic terms. To extend the linear range of duty cycles of the pulse signal, and thus to extend the linear range of available DC output voltage towards small values, the periodic waveform is a ramp signal having a ramp that extends between a minimum voltage level and a maximum voltage level, and the ramp of the ramp signal has an initial start section extending from the minimum voltage level and a main section extending between the initial section and the maximum voltage level. The slope of the ramp has a constant value over the main ramp section and a value greater than the constant value over the initial section. The slope in the initial section of the ramp is preferably varied in a manner to compensate for non-linearity of the comparator in an operating range where the reference voltage is close to the minimum voltage level of the ramp signal.

In a preferred embodiment, a fixed fraction of a demanded output voltage developed at the output of the switching cell is applied to the first differential input of the error amplifier. Thus, the power train operates at a fixed gain, and is thus optimally compensated for all output voltages.

In a further improvement of this concept, the adjustable reference voltage source comprises a fixed reference source and an adjustable gain amplifier. A fixed reference voltage from the fixed reference voltage source is applied to an input of the amplifier and an output of the amplifier provides the adjustable reference voltage.

DETAILED DESCRIPTION OF THE DRAWINGS

Figure 1:
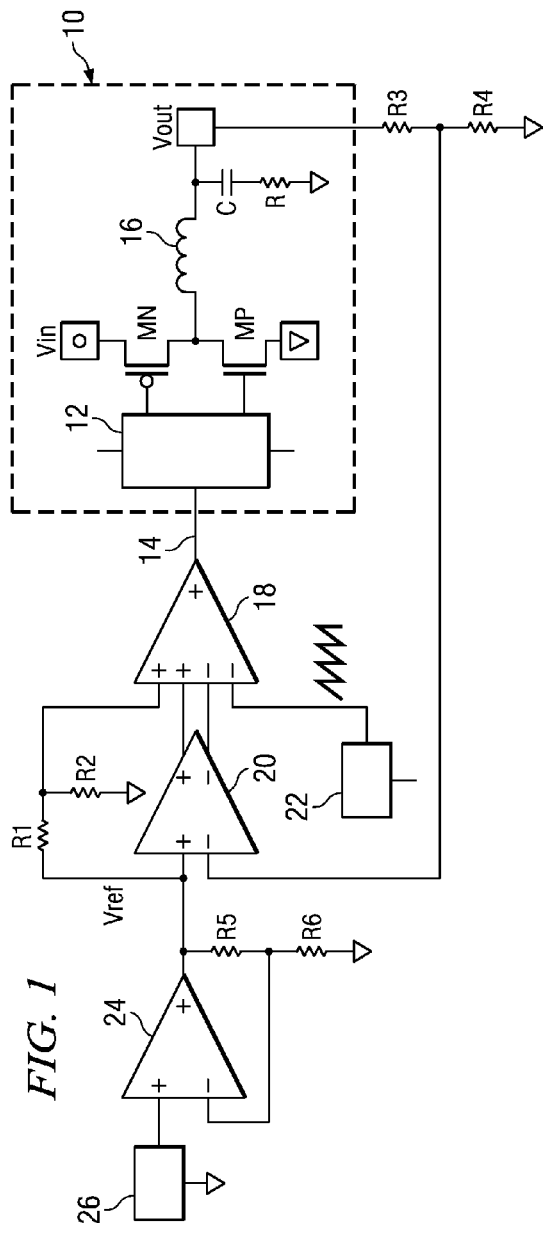
FIG. 1 is a schematic circuit diagram of a switch mode power converter according to this invention.

With reference to FIG. 1, a DC-DC buck converter is shown with a switching cell 10 that has a supply port for an input voltage Vin and an output port for an output voltage Vout. Switching cell 10 has a pair of push-pull transistors MN and MP connected between the supply port and ground and a gate driver 12 with outputs connected to the gates of transistors MN and MP and a control input 14. The connecting node between transistors MN and MP is connected to the output port through an inductor 16. A capacitor C and a resistor R are connected in series between the output port and ground.

A summing comparator 18 has an output connected to the control input 14 of switching cell 10 and two pairs of differential inputs. The first pair of differential inputs (the "inner" inputs in the figure) is connected to differential outputs of an error amplifier 20. The inverting input of the second pair is connected to the output of an oscillator 22 that generates a saw-tooth waveform at a fixed frequency. The non-inverting input of the second pair is connected to a tap node of a resistive divider that includes series-connected resistors R1 and R2.

A fixed fraction of the output voltage Vout is taken from a resistive divider with resistors R3 and R4 connected in series between the output port and ground, and is supplied to an inverting input of error amplifier 20. An adjustable reference voltage Vref is applied to the non-inverting input of error amplifier 20 and to resistor R1 at its terminal opposite its connection with resistor R2. The adjustable reference voltage Vref is provided by the output of a differential amplifier 24 the gain of which is adjusted by a feedback loop comprising resistors R5 and R6 connected is series between the output of amplifier 24 and ground, the connection node between resistors R5, R6 being connected to the inverting input of amplifier 24. A fixed voltage from a fixed reference voltage source 26 is applied to the non-inverting input of amplifier 24.

The converter is preferably implemented as an integrated CMOS circuit. While most of the components shown in the figure will be incorporated in the integrated circuit (except for the LC filter formed by inductor 16 and capacitor C), the resistive divider comprising resistors R5 and R6 will be external to the integrated circuit.

In operation, the summing comparator 18 compares the ramp voltage from oscillator 22 with a fixed fraction of the adjustable reference voltage Vref. If the fixed fraction of the reference voltage Vref is half the ramp height of the saw-tooth signal, the output of summing comparator provides a pulse signal with a 50:50 duty cycle. A larger or lower reference voltage Vref would shift the cross-point of summing comparator 18, resulting in a corresponding change of the duty cycle. The pulse signal from comparator 18 is amplified in gate driver 12 so switch transistors MN and MP alternatingly on and off, thereby producing output voltage Vout as is well known. The outputs from error amplifier 20 also act to shift the cross-point in summing comparator 18 to correct any error in output voltage Vout. However, the DC accuracy of the inventive power converter is inherently high, and so only minor corrections are necessary to correct small parasitic terms. As a result, a regulated output voltage Vout is obtained the level of which may be adjusted with high accuracy in a wide range by adjusting the reference voltage Vref with external resistors R5 and R6.

In the preferred embodiment, the ramp height of the saw-tooth signal from oscillator 22 is proportional to the level of the input voltage Vin at the supply input. As is well known, the gain of a modulator as disclosed is equal to the Supply Voltage divided by the ramp height. Having a supply voltage of 2.5 thru 6 volts gives a variation in the gain of 7.6 dB over the supply voltage range. From a 'load regulation' point of view, the worst case situation is low supply voltage. From a control-loop stabilization point of view the worst case is high supply voltage. Making the ramp height proportional to the supply results in a constant gain for the modulator. In a specific embodiment, a default ramp height of Vin/10 is used.

Figure 2:
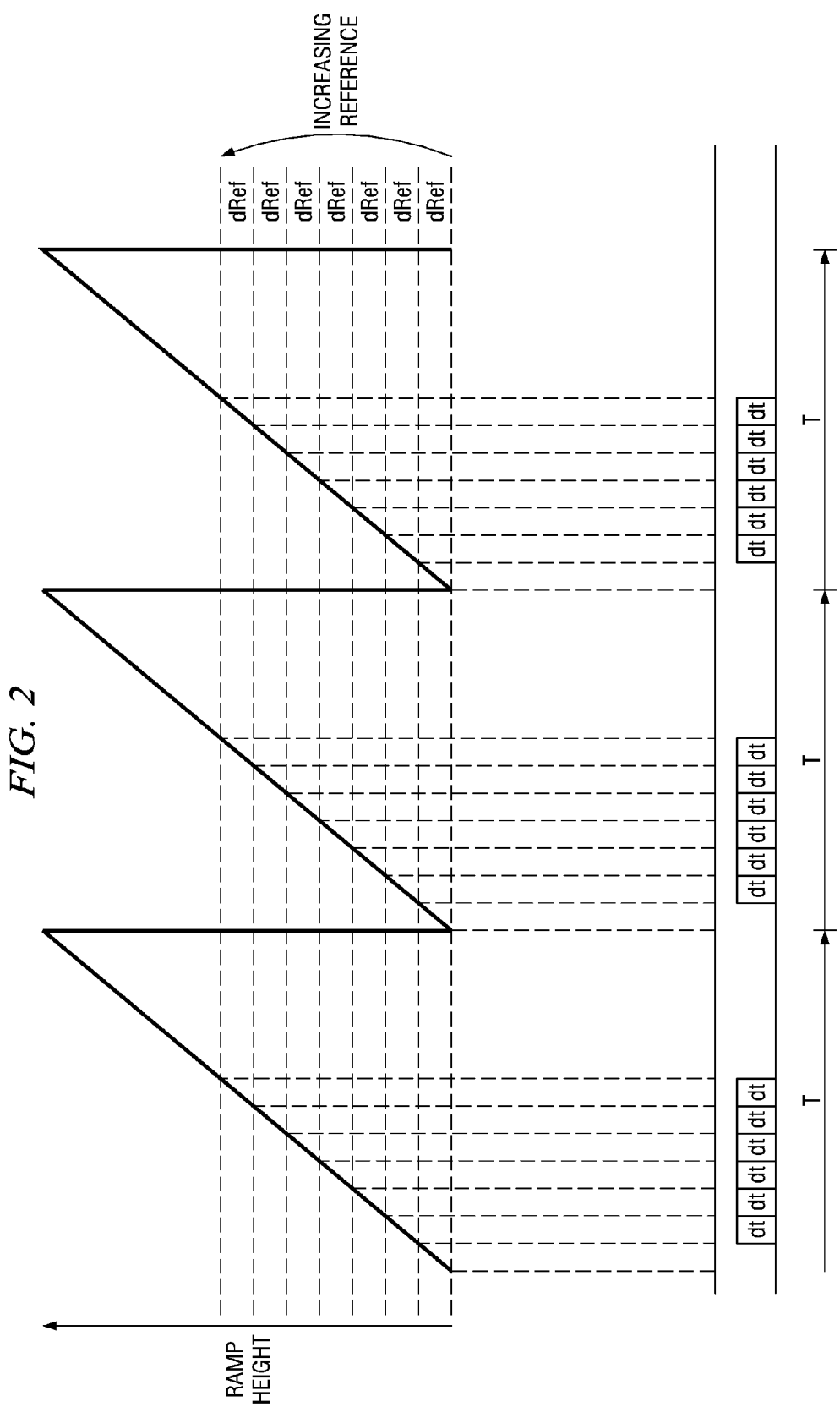
FIG. 2 is a diagram illustrating ideal operation of a converter.

For a perfect comparator and a perfect (linear) saw-tooth, for a period T, the change dT in pulse width for a change dRef in reference voltage is equal to:

$$dT = T*dRef/\text{Ramp\_height},$$

as illustrated in FIG. 2.

Due to non-linearity of the comparator, however, the above equation is not satisfied when the reference voltage is close to the minimum of the saw-tooth ramp.

Figure 3:
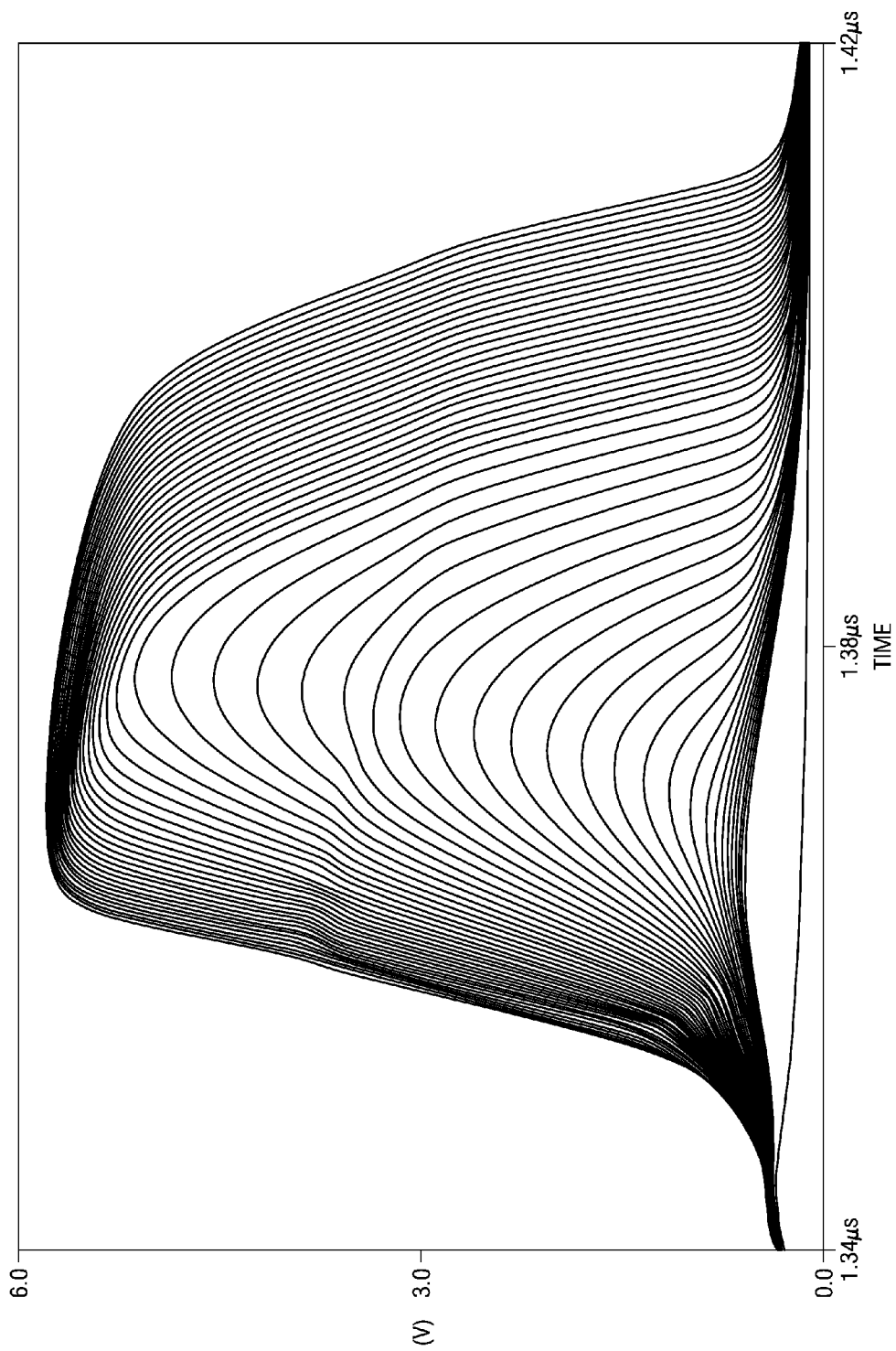
FIG. 3 is a chart showing the shape of narrow output pulses with a conventional converter.

The plot in FIG. 3 shows very fine detail as the modulator reference potential is moved successively through the region of operation giving rise to narrow pulses (small duty-cycles). It is seen that there is an area of operation where the high impedance point does not reach the positive rail (6v), and that during this area, the time-difference between crossing the supply midpoint in falling and rising directions varies much quicker than when the reference point is moved to a position where the hi-z (high impedance) point is reaching the supply rail between the rising and falling edge. The plot attempts to illustrate the rapid change in 'pulse width' as it is made to vary through the critical region. It should be clear that changes in pulse-width with respect to the 'reference voltage' are much greater through this region. This translates into the modulator having a much higher 'small signal' gain for small duty cycles. Eventually, a point is reached where the pulses grow almost linearly with offset.

Figure 4:
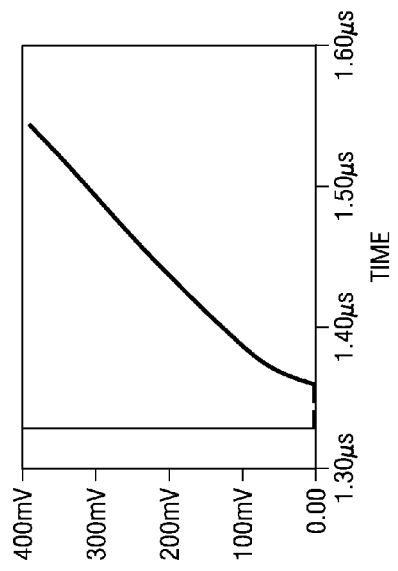
FIG. 4 illustrates the geometry of a saw-tooth ramp used in accordance with the principles of the invention.

In the method of the invention, a modified geometry is used for the saw-tooth ramp to compensate for non-linearity of the comparator at small duty cycles. With reference to FIG. 4, it is seen that the ramp, starting from the minimum voltage of the ramp, has an initial section with a slope that is greater than the slope in the remaining section where the slope is constant. In that initial ramp section which, in FIG. 4, extends substantially from time 1.35 μs to time 1.40 μs, the slope gradually decreases to converge to that in the linear section. As is also seen in FIG. 4, a short blanking period is inserted after the falling edge of the waveform and the initial section of the ramp.

Figure 5:
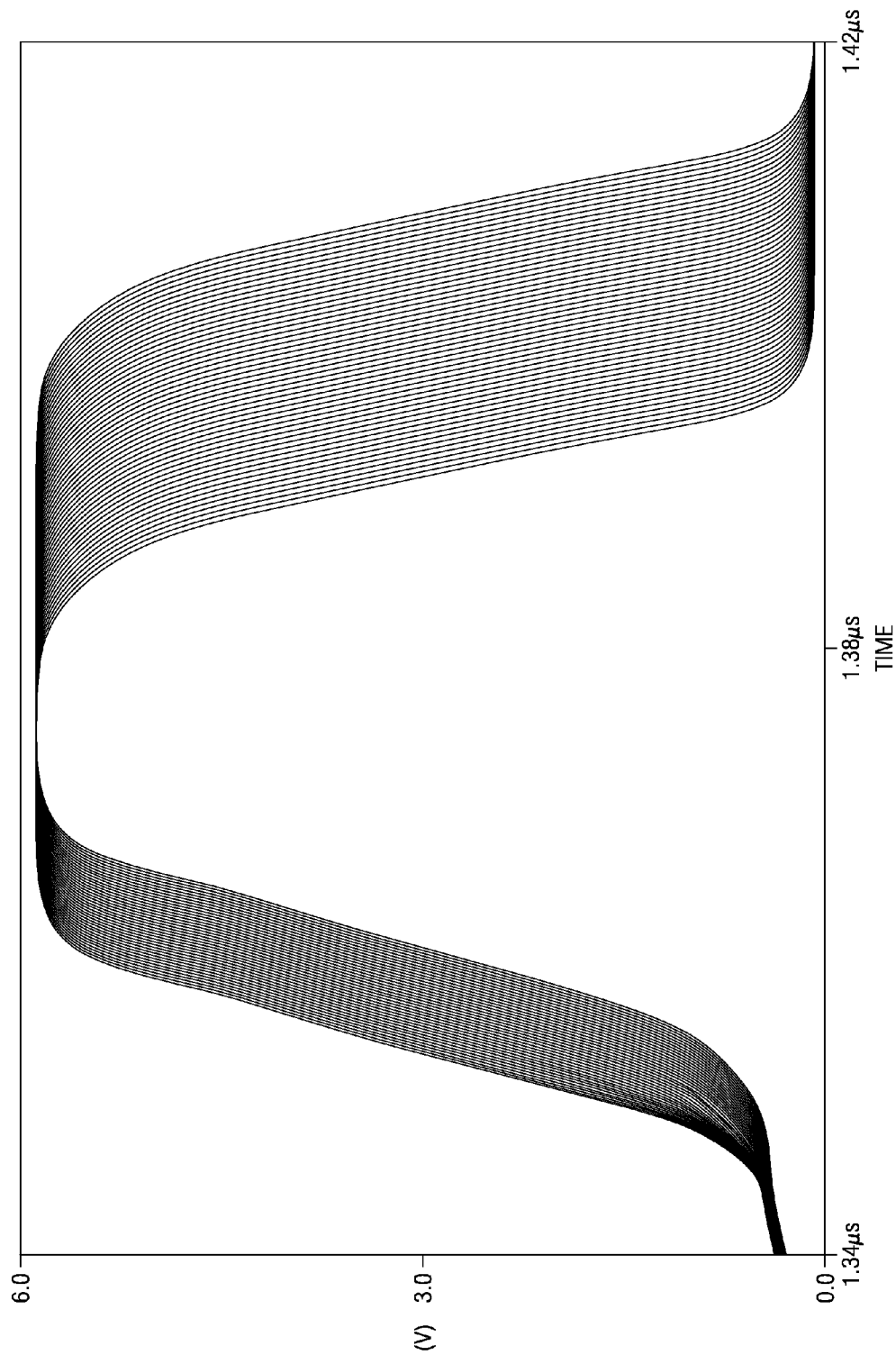
FIG. 5 is a chart showing the shape of narrow output pulses with a converter operating in accordance with the invention.

The results are illustrated in FIG. 5. The waveform shown therein illustrates the voltage at the comparator's high impedance node as the reference voltage is moved through an identical pattern to the scenario in FIG. 3. What is relevant to observe is the growth in the width of the pulses, and how much more linear it is in comparison to FIG. 3. This clearly translates into a "small signal" gain of the comparator being much more constant over a wider range of duty cycles.

Figure 6:
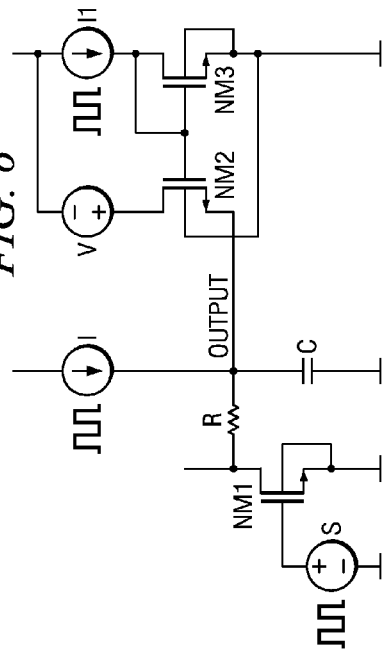
FIG. 6 is a schematic diagram of a circuit in an oscillator for generating a saw-tooth signal with the geometry illustrated in FIG. 4.

FIG. 6 shows a circuit arrangement to be used in an oscillator for generating a saw-tooth signal as shown in FIG. 4. Ignoring first all other components contained in the arrangement, a current source I charges up a capacitor C to generate a linear ramp with slope I/C. An NMOS transistor NM1 is connected through a resistor R to the ramp output. The gate of transistor MN1 is connected to a pulsed signal source S. When the gate of transistor NM1 is high, NM1 will turn on and divert the charging current fro current source I, thus holding off the growth of the ramp until NM1 is turned off. The shape and timing of the waveform applied to the gate of NM1 can thus be used to shape the overall ramp output. In particular, the shape and timing are selected to insert a short blanking period after the falling edge of the waveform and the beginning of the ramp. To accelerate the charging of capacitor C in the initial ramp section, the ramp output is additionally connected to the source of an NMOS transistor NM2. The gate of NM2 is connected to a diode-connected NMOS transistor MN3, biased up by a current source I1. A voltage source V provides drain bias for NM2. Diode-connected MN3 has a W/L (width/length) ratio much smaller than NM2, and therefore, when the capacitor C is discharged, the source of NM2 will shunt an additional current into capacitor C to give an accelerated slope at the beginning of the ramp. As the ramp voltage rises, transistor MN2 will turn off, thus reducing the ramp slope to the standard I/C.

The above circuit arrangement is but an example of how the modified ramp geometry of FIG. 4 can be obtained easily.

The invention claimed is:

1. A method of generating a pulsed output signal from a periodic ramp signal and a reference voltage, the ramp signal and the reference voltage being applied to inputs of a comparator and the output signal being taken from an output of the comparator, the ramp signal having a ramp that extends between a minimum voltage level and a maximum voltage level, wherein the duty cycle of the pulse signal is controlled by varying the reference voltage between the minimum and maximum voltage levels, and the ramp has an initial start section extending from the minimum voltage level and a main section extending between the initial section and the maximum voltage level, the slope having a constant value over the main ramp section and a value greater than the constant value over the initial section.

2. The method according to claim 1, wherein the slope in the initial section of the ramp is varied in a manner to compensate for non-linearity of the comparator in an operating range where the reference voltage is close to the minimum voltage level.

3. The method according to claim 2, wherein a blanking period is inserted before the initial ramp section.

4. A switch mode power converter comprising:
a switching cell with a supply input, an output and a control input;
a summing comparator having first and second differential input pairs and an output, the output being connected to the control input of the switching cell;
an oscillator providing a periodic waveform that is applied to a first one of the inputs of the first differential input pair of the summing comparator;
an adjustable reference voltage source providing an adjustable reference voltage a predetermined fraction of which is applied to a second one of the inputs of the first differential input pair of the summing comparator; and
an error amplifier having differential outputs coupled to the second pair of differential inputs of the summing comparator and a differential input pair, a first input of said differential input pair being coupled to the output of the switching cell, the adjustable reference voltage from the adjustable reference voltage source being applied to a second input of said differential input pair,
wherein the periodic signal is a ramp signal having a ramp that extends between a minimum voltage level and a maximum voltage level, the duty cycle of the pulse signal being controlled by varying the reference voltage between the minimum and maximum voltage levels, and the ramp has an initial start section extending from the minimum voltage level and a main section extending between the initial section and the maximum voltage level, the slope having a constant value over the main ramp section and a value greater than the constant value over the initial section.

5. The power converter according to claim 4, wherein a fixed fraction of a demanded output voltage developed at the output of the switching cell is applied to the first differential input of the error amplifier.

6. The power converter according to claim 4, wherein the adjustable reference voltage source comprises a fixed reference source, an adjustable gain amplifier having an input and an output, a fixed reference voltage from the fixed reference voltage source being applied to said input and said output providing the adjustable reference voltage.

7. The power converter according to claim 6, further comprising a resistive voltage divider connected to the output of the adjustable gain amplifier and providing said predetermined fraction of the adjustable reference voltage.

8. The power converter according to claim 6, wherein the adjustable gain amplifier has a feedback loop with an adjustable resistive voltage divider.

9. The power converter according to claim 7 and being implemented as an integrated CMOS circuit, the resistive voltage divider being external to the integrated circuit.

10. An oscillator for generating a saw-tooth signal for use in a switch mode power converter or in a class-d amplifier, in particular for use in a power converter as defined in claim 4, comprising a circuit arrangement with:
a current source (I) connected in series with a capacitor (C), an interconnection node between the current source and the capacitor forming an output of the oscillator;
a first MOS transistor (MN1) connected to the interconnection node and having a gate connected to a source (S) of a pulsed waveform;
a second MOS transistor (MN2) having a source connected to the interconnection node and a drain connected to a bias voltage source (V); and
a third MOS transistor (NM3) which is diode-connected and up-biased by a current source (I1), the drain and gate of the third MOS transistor (MN3) being connected to the gate of the second MOS transistor (MN2).

11. The oscillator according to claim 10, wherein the pulsed waveform applied to the gate of the first MOS transistor (MN1) has a shape and timing such that a short blanking period is inserted between the falling edge of the saw-tooth waveform and the beginning of the ramp.

* * * * *